United States Patent
Lee et al.

(10) Patent No.: US 12,066,495 B2
(45) Date of Patent: Aug. 20, 2024

(54) BATTERY CELL JIG INCLUDING FILM-TYPE PRESSURE SENSOR, AND METHOD FOR MEASURING SWELLING OF BATTERY CELL

(71) Applicant: LG ENERGY SOLUTION, LTD., Seoul (KR)

(72) Inventors: Jong Hwa Lee, Daejeon (KR); Dae Sik Chung, Daejeon (KR); Su Han Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 123 days.

(21) Appl. No.: 17/791,644

(22) PCT Filed: Jul. 30, 2021

(86) PCT No.: PCT/KR2021/009981
§ 371 (c)(1),
(2) Date: Jul. 8, 2022

(87) PCT Pub. No.: WO2022/025705
PCT Pub. Date: Feb. 3, 2022

(65) Prior Publication Data
US 2023/0045364 A1 Feb. 9, 2023

(30) Foreign Application Priority Data

Jul. 31, 2020 (KR) ........................ 10-2020-0095681

(51) Int. Cl.
*G01R 31/30* (2006.01)
*G01R 31/385* (2019.01)
*H01M 10/42* (2006.01)

(52) U.S. Cl.
CPC .... *G01R 31/3865* (2019.01); *H01M 10/4285* (2013.01)

(58) Field of Classification Search
None
See application file for complete search history.

(56) References Cited

U.S. PATENT DOCUMENTS 10,983,170 B1 * 4/2021 Kadirvel ............. H01M 50/204
2015/0295208 A1 10/2015 Schumann et al.
(Continued)

FOREIGN PATENT DOCUMENTS

CN 106461386 A 2/2017
CN 106816660 A 6/2017
(Continued)

OTHER PUBLICATIONS

European Search Report issued in corresponding European Patent Application No. 21851235.8, dated Aug. 17, 2023.
(Continued)

*Primary Examiner* — Jas A Sanghera
(74) *Attorney, Agent, or Firm* — MORGAN, LEWIS & BOCKIUS LLP (57) ABSTRACT

The present technology relates to a battery cell jig including film-type pressure sensors, and a method of measuring a swelling of a battery cell using the same. According to the present invention, by using film-type pressure sensors, the volume of the measuring apparatus can be reduced, and abnormal degeneration of the battery cell by the pressure difference for each location of the battery cell can be prevented.

20 Claims, 4 Drawing Sheets

(56) References Cited

U.S. PATENT DOCUMENTS

| | | |
|---|---|---|
| 2017/0074634 A1 | 3/2017 | Yoon et al. |
| 2017/0155256 A1 | 6/2017 | Fujimaki et al. |
| 2018/0123189 A1 | 5/2018 | Biswas et al. |
| 2019/0094003 A1* | 3/2019 | Kim .................. G01R 31/392 |
| 2020/0076011 A1 | 3/2020 | Choi et al. |
| 2021/0270908 A1* | 9/2021 | Masuda ............ H01M 10/0525 |
| 2023/0146021 A1* | 5/2023 | Landesfeind ....... H01M 50/578 |
| | | 429/7 |

FOREIGN PATENT DOCUMENTS

| | | | |
|---|---|---|---|
| CN | 108196677 | A | 6/2018 |
| CN | 108448158 | A | 8/2018 |
| CN | 110988718 | A | 4/2020 |
| DE | 102014206813 | A1 | 10/2015 |
| DE | 102018207436 | A1 | 11/2019 |
| EP | 3 675 272 | A1 | 7/2020 |
| JP | 2013-020826 | A | 1/2013 |
| JP | 5790219 | B2 | 10/2015 |
| JP | 2019-135458 | A | 8/2019 |
| KR | 20160064871 | A | 6/2016 |
| KR | 10-2017-0042082 | A | 4/2017 |
| KR | 10-1741193 | B1 | 5/2017 |
| KR | 10-2018-0136192 | A | 12/2018 |
| KR | 10-2019-0090291 | A | 8/2019 |
| KR | 10-1983849 | B1 | 9/2019 |
| KR | 10-2034771 | B1 | 10/2019 |
| KR | 10-2019-0124498 | A | 11/2019 |
| KR | 10-2020-0026416 | A | 3/2020 |
| KR | 10-2020-0059483 | A | 5/2020 |
| WO | 2012/170873 | A2 | 12/2012 |
| WO | 2017/087807 | A1 | 5/2017 |
| WO | 2018/124679 | A1 | 7/2018 |

OTHER PUBLICATIONS

International Search Report (with partial translation) and Written Opinion dated Nov. 10, 2021 issued in corresponding International Patent Application No. PCT/KR2021/009981.
Office Action issued in Chinese Patent Application 202180008429.3 dated May 24, 2024.

* cited by examiner

BATTERY CELL JIG INCLUDING FILM-TYPE PRESSURE SENSOR, AND METHOD FOR MEASURING SWELLING OF BATTERY CELL

TECHNICAL FIELD

This application claims the benefit of priority based on Korean Patent Application No. 10-2020-0095681, filed on Jul. 31, 2020, and the entire contents of the Korean patent application are incorporated herein by reference.

The present invention relates to a battery cell jig including a film-type pressure sensor, and a method for measuring a swelling of a battery cell.

BACKGROUND ART

In recent years, as the price of energy sources increases due to the depletion of fossil fuels and the interest of environmental pollution is amplified, the demand for environmentally friendly alternative energy sources has become an indispensable factor for future life. As such, various researches on power generation technologies such as nuclear power, solar power, wind power, and tidal power have been continued, and electric power storage devices for more efficient use of such generated energy have also been attracting much attention.

In particular, with the development of technology and demand for mobile devices, the demand for batteries as energy sources is rapidly increasing, and accordingly, a lot of researches on batteries capable of meeting various demands have been conducted.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having advantages such as high energy density, discharge voltage, and output stability.

Such a secondary battery is formed in a structure such that an electrode assembly including a positive electrode, a negative electrode, and a separator disposed therebetween is built in a battery case, and positive and negative electrode tabs are welded to two electrode leads and are sealed to be exposed to the outside of the battery case. The electrode tab is electrically connected to the external device through contact with the external device, and the secondary battery supplies power to the external device through the electrode tab or receives power from the external device.

As the battery is operated in an abnormal state by overcharge, over discharge, overheating, and external impact, etc., gas may be generated inside the secondary battery. For example, overheated battery may generate gas and promote the decomposition reaction of battery elements, thereby causing continuous heating, gas generation, and a swelling phenomenon. This phenomenon also appears in the slow deterioration process of secondary batteries due to long-term use. As such, in order to manufacture a battery cell having uniform charge/discharge characteristics, it is necessary to measure the pressure change according to the volume change of the battery cell.

Conventionally, a dedicated device was used to measure the pressure change of the battery cell during charge/discharge.

However, since the conventional equipment for measuring the pressure of battery cells has a large weight and volume, there is a spatial limitation in the battery evaluation. Further, when evaluating a battery, if the existing pressure sensor is used, the difference in pressure occurs for each location of the battery cell by the thickness of the pressure sensor, thereby causing abnormal degeneration of the battery cell.

DISCLOSURE

Technical Problem

The present invention is believed to solve at least some of the above problems. For example, an aspect of the present invention provides a battery cell jig including a film-type pressure sensor, and a method for measuring a swelling of a battery cell using the same.

Technical Solution

The present invention is believed to solve at least some of the above problems. For example, an aspect of the present invention provides a battery cell jig including a film-type pressure sensor. In one example, a battery cell jig according to the present invention includes: first and second plates which have a battery cell therebetween and press two surfaces of the battery cell; bolts and nuts which fix the first and second plates to press the battery cell; a charge and discharge unit which is electrically connected to the battery cell; and a sensor unit which is positioned between the battery cell and the first plate and measures a pressure that is changed when the battery cell is charged or discharged. Herein, the sensor unit has a structure where n film-type pressure sensors are arranged on a substrate (the n is an integer equal to or greater than 2).

In one example, the battery cell jig according to the present invention further includes: an output unit which is connected to the sensor unit and outputs a pressure value of the battery cell; and a storage unit which stores an output value which is output from the output unit.

In a specific example, the n film-type pressure sensors may be connected to each other by a flexible print circuit (FPC) pattern, and pressure values measured in the n film-type pressure sensors may be collected as one output value and the output value is then output. At this time, the n film-type pressure sensors may be arranged on a front surface of the substrate and may be uniformly arranged along a first direction and a second direction.

Further, each of the film-type pressure sensors may be a pressure sensitive resistor (PSR) sensor.

In another example, the sensor unit of the battery cell jig according to the present invention may be arranged on one side surface of the battery cell and may further include a pressing plate at a space between the sensor unit and the first plate. At this time, a coil spring may be arranged between the pressing plate and the first plate.

In another example, a plurality of battery cells may be laminated and accommodated between the first and second plates, and the plurality of battery cells may be electrically connected to each other in series or in parallel.

Further, the present invention provides a method for measuring a swelling of a battery cell using the above-described battery cell jig. In one example, the method for measuring a swelling of a battery cell according to the present invention includes measuring a swelling of a battery cell by inducing a swelling of the battery cell according to charge and discharge by arranging the battery cell on the battery cell jig according to claim 1, and sensing a pressure change of the battery cell using the film-type pressure sensors of the sensor unit.

At this time, the measuring of the swelling of the battery cell may include collecting pressure values measured in n film-type pressure sensors as one output value and outputting the output value.

Advantageous Effects

According to a battery cell jig including a film-type pressure sensor, and a method for measuring a swelling of a battery cell of the present invention, the pressure change of the battery cell can be easily measured using n film-type pressure sensors (n is an integer equal to or greater than 2). In particular, the battery cell jig of the present invention can reduce the volume of the measuring apparatus and can prevent the abnormal degeneration of the battery cell by the difference in pressure for each location of the battery cell.

DETAILED DESCRIPTION OF THE PREFERRED EMBODIMENTS

As the inventive concept allows for various changes and numerous embodiments, particular embodiments will be illustrated in the drawings and described in detail in the text. However, this is not intended to limit the present invention to the specific form disclosed, and it should be understood to include all changes, equivalents, and substitutes included in the spirit and scope of the present invention.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof. Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

The present invention relates to a battery cell jig including a film-type pressure sensor, and a method for measuring a swelling of a battery cell.

As described above, the pressure measurement jig for measuring the pressure change of the conventional battery cell has a large weight and volume, and accordingly, there is a spatial limitation in the battery evaluation. Further, when evaluating a battery, if the existing pressure sensor is used, the difference in pressure occurs for each location of the battery cell by the thickness of the pressure sensor itself, thereby causing abnormal degeneration of the battery cell.

As such, the inventors of the present invention invented a battery cell jig for reducing the volume of a measuring apparatus and preventing abnormal degeneration of a battery cell due to the pressure difference for each location of the battery cell, and a method of measuring a swelling of a battery cell using the same. Specifically, the battery cell jig of the present invention can reduce the volume of the measuring apparatus and can prevent the abnormal degeneration of the battery cell by the difference in pressure for each location of the battery cell.

Figure 1:
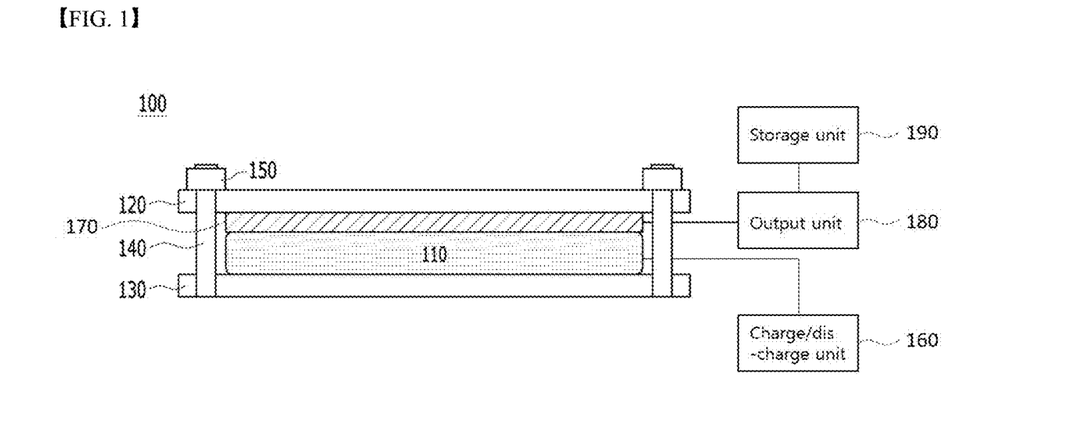
FIG. 1 is a schematic view of a battery cell jig according to an embodiment of the present invention.
Figure 2:
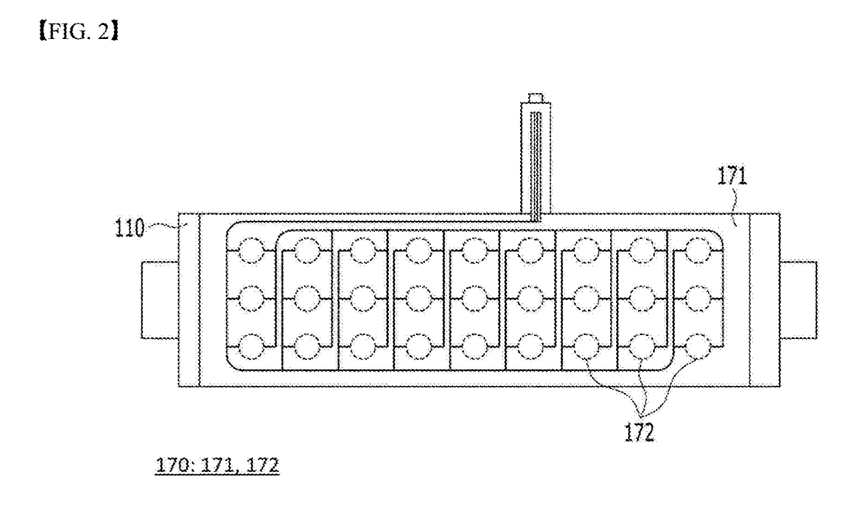
FIG. 2 is a schematic diagram showing a sensor unit of a battery cell jig according to one embodiment of the present invention.

FIG. 1 is a schematic view of a battery cell jig according to the present invention, and FIG. 2 is a schematic view showing a sensor unit of a battery cell jig according to the present invention.

Referring to FIGS. 1 and 2, a battery cell jig 100 according to the present invention includes: first and second plates 120 and 130 which have a battery cell therebetween and press two surfaces of the battery cell; bolts 140 and nuts 150 which fix the first and second plates 120 and 130 to press the battery cell 110; a charge and discharge unit 160 which is electrically connected to the battery cell 110; and a sensor unit 170 which is positioned between the battery cell 110 and the first plate 120 and measures a pressure that is changed when the battery cell 110 is charged or discharged. At this time, the sensor unit 170 may have a structure where n film-type pressure sensors are arranged on a substrate. Herein, the n is an integer equal to or greater than 2.

Herein, the battery cell 110, which is interposed between the first and second plates 120 and 130, may be a pouch-type unit cell. Specifically, the pouch type unit cell may have a structure that an electrode assembly having a positive electrode/separator/negative electrode structure is embedded in an exterior material of the laminate sheet in a state that is connected to electrode leads formed outside the exterior material. Further, the electrode leads may be drawn to the outside of the sheet and may be extended in the same or opposite direction to each other.

Further, the first and second plates 120 and 130 may be general plates which are used when evaluating charge/discharge characteristics of the battery cell 110, for example, aluminum plates.

In one example, the battery cell jig 100 according to the present invention measures the pressure change of the battery cell 110 using film-type pressure sensors 172 during the charge/discharge of the battery cell 110. Specifically, the film-type pressure sensor 172 is a pressure sensitive resistor (PSR) sensor and can sense pressure or force, and is a sensor for measuring the changed value of resistance according to the change of pressure or force applied to the surface of the PSR sensor. In particular, the PSR sensor is a thin film type and can reduce the volume of an apparatus for measuring the pressure of the battery cell 110 and can prevent abnormal degeneration of the battery cell 110 by the pressure difference for each location of the battery cell 110.

In one example, the sensor unit 170 of the battery cell jig 100 according to the present invention includes a substrate and film-type pressure sensors 172. The substrate may be made of an insulating flexible material and may have a size corresponding to the area of one surface of the battery cell 110. In addition, the film-type pressure sensor 172 may be disposed on the front surface of the substrate 171. Specifically, the film-type pressure sensors 172 are arranged on the front surface of the substrate 171 and are uniformly arranged along the first direction and the second direction. Here, the first direction may refer to the row direction, and the second direction may refer to the column direction. Namely, n film-type pressure sensors 172 may be uniformly arranged along the first direction and the second direction of the substrate 171 so that the sensor unit 170 can evenly sense the entire area of the battery cell 110. It is illustrated that there are 18 film-type pressure sensors 172, but the number of the film-type pressure sensors 172 may be selectable in the range of 2 to 100 or 5 to 50. At this time, the n film-type pressure sensors may be connected to each other in a flexible print circuit (FPC) pattern. Namely, the sensor unit 170 may have a structure that n film-type pressure sensors 172 are arranged on an insulating, flexible substrate, and the film-type pressure sensors 172 are connected by an electronic circuit.

Further, according to the present invention, pressure values, which are measured in the n film-type pressure sensors 172 connected in the FPC pattern, are collected as one output value, and the output value is output. Namely, the pressure values, which are measured in the n film-type pressure sensors 172, are not individually output, and the sum of the pressure values measured in the n film-type pressure sensors 172 is output. For example, the output value may be s+2s+3s+ . . . +ns.

The conventional FSR pressure sensor had a limitation in being used as a sensor for measuring the pressure of the battery cell 110 because maximum measurable pressure range was narrow. However, in the case of the present invention, since the pressure values, which are measured in a plurality of film-type pressure sensors 172, can be collected as one output value, the measurable pressure range can be widened.

Further, the battery cell jig 100 for measuring a swelling of a battery cell according to the present invention may further include a charge/discharge unit 160 which is electrically connected to the battery cell 110. The charge/discharge unit 160 may supply power for charge to the battery cell 110 or receive discharge power from the battery cell 110. Herein, supplying power to the battery cell 110 is not limited to supplying power which is sufficient for fully charging the battery cell 110. The same may be applied to the meaning of receiving discharge power from the battery cell 110, and thus repeated description thereof is omitted here.

Further, the battery cell jig 100 according to the present invention further includes an output unit 180 which is connected to the sensor unit 170 and outputs the pressure value of the battery cell 110 and a storage unit 190 which stores the output value which is output from the output unit 180.

In one example, the output unit 180 may numerically calculate and display the change in pressure which is applied from the battery cell 110 based on the signal inputted from the n film-type pressure sensors 172, and may output the change in pressure, which is applied from the battery cell 110, in real time. Further, the storage unit 190 may receive the output value from the output unit 180 and store the output value and may store information on the swelling result of the battery cell 110 and build a database based on the information. For example, information on the pressure value for the driving condition of the charge/discharge unit may be made and stored as a table or a graph. Such measurement data can be used as the basis for predicting the swelling degree or input value of the battery cell 110 when various charge/discharge conditions of the charge/discharge unit 160 are combined.

Figure 3:
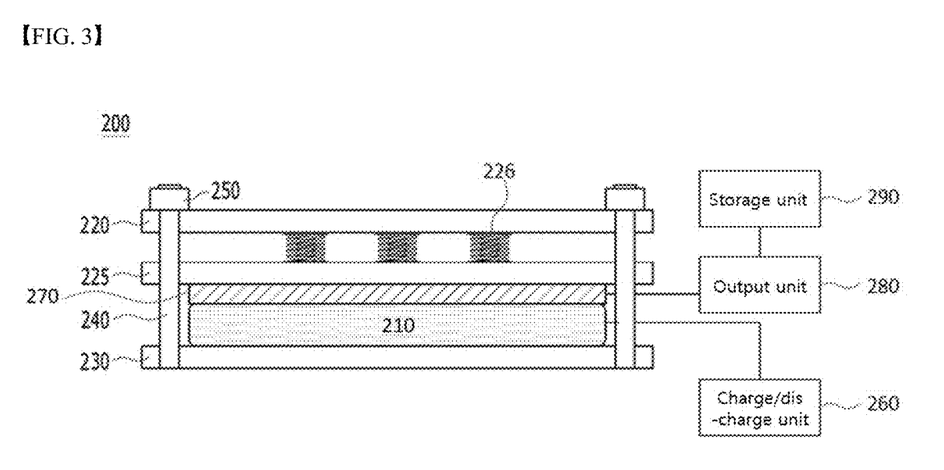
FIG. 3 is a schematic view of a battery cell jig according to another embodiment of the present invention.

FIG. 3 is a schematic view of a battery cell jig according to another embodiment of the present invention.

In another example, the battery cell jig 200 according to the present invention further includes a pressing plate 225. In a specific example, the sensor unit 270 has a structure that is arranged on one side surface of the battery cell 210, and the battery cell jig 200 according to the present invention may further include the pressing plate 225 between the sensor unit 270 and the first plate 220.

The pressing plate 225 is a plate for applying constant pressure to the battery cell 210 and may have a structure which is fastened by bolts 240 and nuts 250 between first and second plates 220 and 230 as in the first and second plates 220 and 230. Further, in order to the pressing plate 225 to apply constant pressure to the battery cell 210, at least one coil spring 226 may be arranged between the pressing plate 225 and the first plate 220. The coil spring 226 may be a compression spring as a spring with a force resistant to the compressive force and is configured to apply constant pressure to the pressing plate 225.

Likewise, when the battery cell 210 is accommodated in the battery cell jig 200, and the battery cell 210 is repeatedly charged and discharged, the battery cell is swollen. At this time, as the battery cell 210 is swollen, the pressing plate 225 is pushed up, and at the same time, the sensor unit 270 measures the pressure which is the swollen value of the battery cell.

Figure 4:
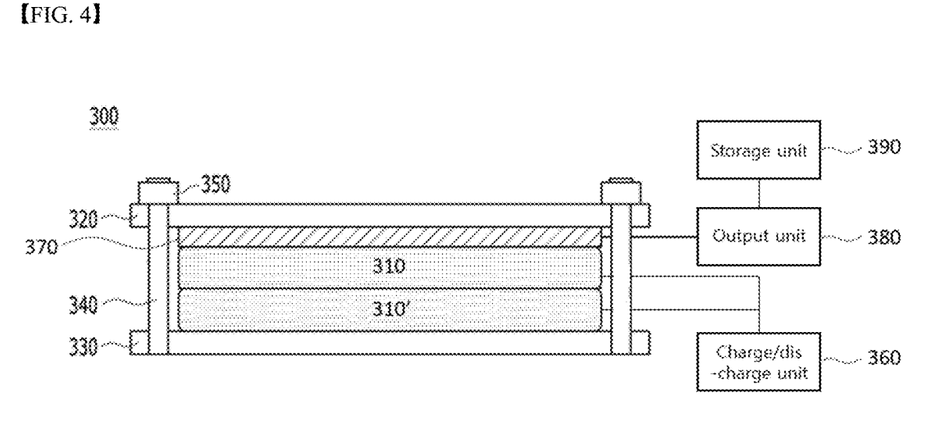
FIG. 4 is a schematic view of a battery cell jig according to further another embodiment of the present invention.

FIG. 4 is a schematic view of a battery cell jig according to further another embodiment of the present invention.

In another example, the battery cell jig 300 according to the present invention has a structure where a plurality of battery cells 310 and 310' are laminated. In a specific example, a plurality of battery cells 310 and 310' are laminated and accommodated between the first and second plates 320 and 330, and the plurality of battery cells 310 and 310' may be electrically connected to each other in series or in parallel. However, the present invention is not limited thereto, and in some cases, it is possible to independently apply power source to each of the battery cells 310 and 310'. The plurality of battery cells 310 and 310' show a structure where 2 battery cells are laminated, and the number of battery cells may be selected, for example, in the range of 2 to 10.

Likewise, when a plurality of battery cells 310 and 310' are laminated and the pressure is simultaneously is measured, the increased status of the pressure can be recognized and analyzed by comparing with the result of measuring only one battery cell 310. For example, 2 battery cells 310 and 310' are laminated and the pressure change is measured, and it is possible to recognize whether the pressure has doubled or the pressure increase was suppressed/amplified, compared to the case of measuring only one battery cell 310.

Further, the present invention provides a method for measuring a swelling of a battery cell using the above-described battery cell jig.

In one example, the method for measuring a swelling of a battery cell according to the present invention includes measuring a swelling of a battery cell by inducing a swelling of the battery cell according to charge and discharge by arranging the battery cell on the battery cell jig according to claim 1, and sensing a pressure change of the battery cell using the film-type pressure sensors of the sensor unit.

In a specific example, the battery cell to be measured is arranged between first and second plates, and a sensor unit is seated on one surface of the battery cell. Further, the separation distance of the first and second plates is fixed by using bolts and nuts. Thereafter, charge/discharge is repeatedly performed by applying a voltage to the battery cell using the charge/discharge unit.

If the battery cell is swollen by repetitive charge/discharge, the first and second plates are pressed by swollen battery cell. Then, the sensor unit can measure the pressure change according thereto.

Further, the measuring of the swelling of the battery cell may include collecting pressure values measured in n film-type pressure sensors as one output value and outputting the output value. In a specific example, n film-type pressure sensors are connected to each other in a FPC pattern, and pressure values, which are measured by the n film-type pressure sensors, can be collected as one output value to thereby be outputted. Namely, the pressure values, which are measured in the n film-type pressure sensors, are not individually output, and the sum of the pressure values measured in the n film-type pressure sensors is output.

As such, according to the method of measuring the swelling of the battery cell of the present invention, it is possible to easily measure the pressure change of the battery cell by using n film-type pressure sensors (n is an integer equal to or greater than 2). In particular, the battery cell jig of the present invention can reduce the volume of the measuring apparatus and can prevent the abnormal degeneration of the battery cell by the difference in pressure for each location of the battery cell.

Although preferred examples of the present invention have been described with reference to drawings, it can be understood that those skilled in the art can make various modifications and changes to the present invention without departing from the spirit and scope of the invention as set forth in the claims below.

Therefore, the technical scope of the present invention should not be limited to the contents described in the detailed description of the specification but should be defined by the claims.

DESCRIPTION OF REFERENCE NUMERALS

100, 200, 300: battery cell jig
110, 210, 310, 310': battery cell
120, 220, 320: first plate
225: pressing plate
226: coil spring
130, 230, 330: second plate
140, 240, 340: bolt
150, 250, 350: nut
160, 260, 360: charge/discharge unit
170, 270, 370: sensor unit
171: substrate
172: film-type pressure sensor
180, 280, 380: output unit
190, 290, 390: storage unit

The invention claimed is:

1. A battery cell jig comprising:
first and second plates configured to have a battery cell therebetween and press two surfaces of the battery cell;
bolts and nuts to fix the first and second plates to press the battery cell;
a charge and discharge unit to electrically connect to the battery cell; and
a sensor unit to be positioned between the battery cell and the first plate and measures a pressure that is changed when the battery cell is charged or discharged,
wherein the sensor unit has a structure where n film-type pressure sensors are arranged on a substrate,
wherein the n is an integer equal to or greater than 2, and
wherein a total sum of pressure values measured in the n film-type pressure sensors is one output value and the one output value is output.

2. The battery cell jig of claim 1, further comprising:
an output unit connected to the sensor unit and outputs a pressure value of the battery cell; and
a storage unit configured to store an output value which is output from the output unit.

3. The battery cell jig of claim 1, wherein the n film-type pressure sensors are connected to each other by a flexible print circuit (FPC) pattern.

4. The battery cell jig of claim 1, wherein the n film-type pressure sensors are arranged on a front surface of the substrate and are uniformly arranged along a first direction and a second direction.

5. The battery cell jig of claim 1, wherein each of the n film-type pressure sensors is a pressure sensitive resistor (PSR) sensor.

6. The battery cell jig of claim 1, wherein the sensor unit is configured to be arranged on one side surface of the battery cell and further includes a pressing plate at a space between the sensor unit and the first plate.

7. The battery cell jig of claim 6, further comprising a coil spring arranged between the pressing plate and the first plate.

8. The battery cell jig of claim 1, wherein the first and second plates are configured to have a plurality of battery cells that are laminated and accommodated between the first and second plates, and
wherein the plurality of battery cells are electrically connected to each other in series or in parallel.

9. A method for measuring a swelling of a battery cell, the method comprising: arranging the battery cell on the battery cell jig according to claim 1, charging and discharging the battery cell to induce the swelling of the battery cell, and sensing a pressure change of the battery cell using the n film-type pressure sensors of the sensor unit.

10. The method of claim 9, further comprising obtaining the total sum of pressure values measured in the n film-type pressure sensors as the one output value and outputting the one output value.

11. A battery cell jig comprising:
first and second plates configured to have a battery cell therebetween and press two surfaces of the battery cell;
bolts and nuts to fix the first and second plates to press the battery cell;
a charge and discharge unit to electrically connect to the battery cell;
a sensor unit to be positioned between the battery cell and the first plate and measures a pressure that is changed when the battery cell is charged or discharged; and
a pressing plate at a space between the sensor unit and the first plate,
wherein the sensor unit has a structure where n film-type pressure sensors are arranged on a substrate,
wherein the n is an integer equal to or greater than 2, and
wherein the sensor unit is configured to be arranged on one side surface of the battery cell.

12. The battery cell jig of claim 11, wherein the n film-type pressure sensors are connected to each other by a flexible print circuit (FPC) pattern, and
wherein pressure values measured in the n film-type pressure sensors are collected as one output value and the output value is output.

13. The battery cell jig of claim 11, wherein the n film-type pressure sensors are arranged on a front surface of the substrate and are uniformly arranged along a first direction and a second direction.

14. The battery cell jig of claim 11, further comprising:
an output unit connected to the sensor unit and outputs a pressure value of the battery cell; and
a storage unit configured to store an output value which is output from the output unit.

15. The battery cell jig of claim 11, wherein each of the n film-type pressure sensors is a pressure sensitive resistor (PSR) sensor.

16. The battery cell jig of claim 11, further comprising a coil spring arranged between the pressing plate and the first plate.

17. The battery cell jig of claim 11, wherein the first and second plates are configured to have a plurality of battery cells that are laminated and accommodated between the first and second plates, and
wherein the plurality of battery cells are electrically connected to each other in series or in parallel.

18. A method for measuring a swelling of a battery cell, the method comprising: arranging the battery cell on the battery cell jig according to claim 11, charging and discharging the battery cell to induce the swelling of the battery cell, and sensing a pressure change of the battery cell using the n film-type pressure sensors of the sensor unit.

19. The method of claim 18, further comprising obtaining a total sum of pressure values measured in the n film-type pressure sensors as one output value and outputting the one output value.

20. A battery cell jig comprising:
first and second plates configured to have a battery cell therebetween and press two surfaces of the battery cell;
bolts and nuts to fix the first and second plates to press the battery cell;
a charge and discharge unit to electrically connect to the battery cell;
a sensor unit to be positioned between the battery cell and the first plate and measures a pressure that is changed when the battery cell is charged or discharged;
a pressing plate at a space between the sensor unit and the first plate; and
a coil spring arranged between the pressing plate and the first plate,
wherein the sensor unit has a structure where n film-type pressure sensors are arranged on a substrate,
wherein the n is an integer equal to or greater than 2,
wherein the n film-type pressure sensors are arranged on a front surface of the substrate and are uniformly arranged along a first direction and a second direction,
wherein each of the n film-type pressure sensors is a pressure sensitive resistor (PSR) sensor, and
wherein the sensor unit is configured to be arranged on one side surface of the battery cell.

* * * * *